(12) United States Patent
Francis

(10) Patent No.: US 6,445,328 B1
(45) Date of Patent: Sep. 3, 2002

(54) LARGE DYNAMIC RANGE DIGITIZING APPARATUS AND METHOD

(75) Inventor: C. Lee Francis, Joppa, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 09/813,902

(22) Filed: Mar. 22, 2001

(51) Int. Cl.[7] ................................................ H03M 1/12
(52) U.S. Cl. ........................ 341/155; 341/139; 341/163
(58) Field of Search ................................ 341/155, 163, 341/139

(56) References Cited

U.S. PATENT DOCUMENTS 3,700,871 A * 10/1972 Montgomery, Jr. et al. . 341/139
5,111,202 A * 5/1992 Rivera et al. ................ 341/139
6,031,478 A * 2/2000 Oberhammer et al. ...... 341/139

* cited by examiner

Primary Examiner—Michael Tokar
Assistant Examiner—Linh V Nguyen
(74) Attorney, Agent, or Firm—Alan P. Klein

(57) ABSTRACT

An apparatus and method for digitizing an analog signal and optimizing the dynamic range of the digitized signal. Dual analog-to-digital converters are preceded by respective amplifiers with different gains for receiving an analog input signal. The digital output signal from the analog-to digital converter preceded by the amplifier of higher gain is selected and stored when it is not clipped. Otherwise, the analog-to-digital converter preceded by the amplifier of lower gain is selected and its digital output signal is stored. Once digital memory is filled, an adaptive formatting program selects the most appropriate parts of the memory words to achieve maximum resolution and dynamic range in an output word size.

14 Claims, 6 Drawing Sheets

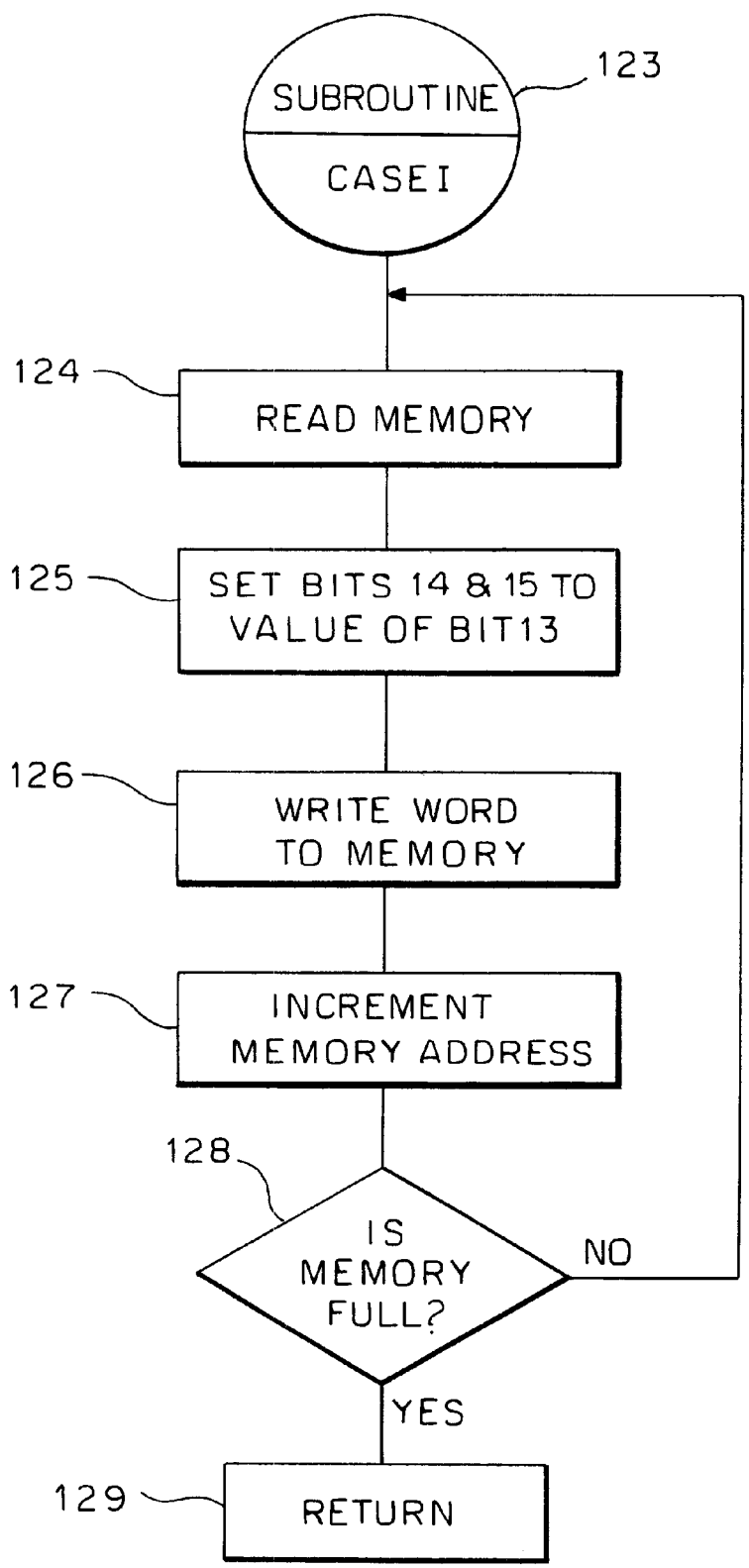

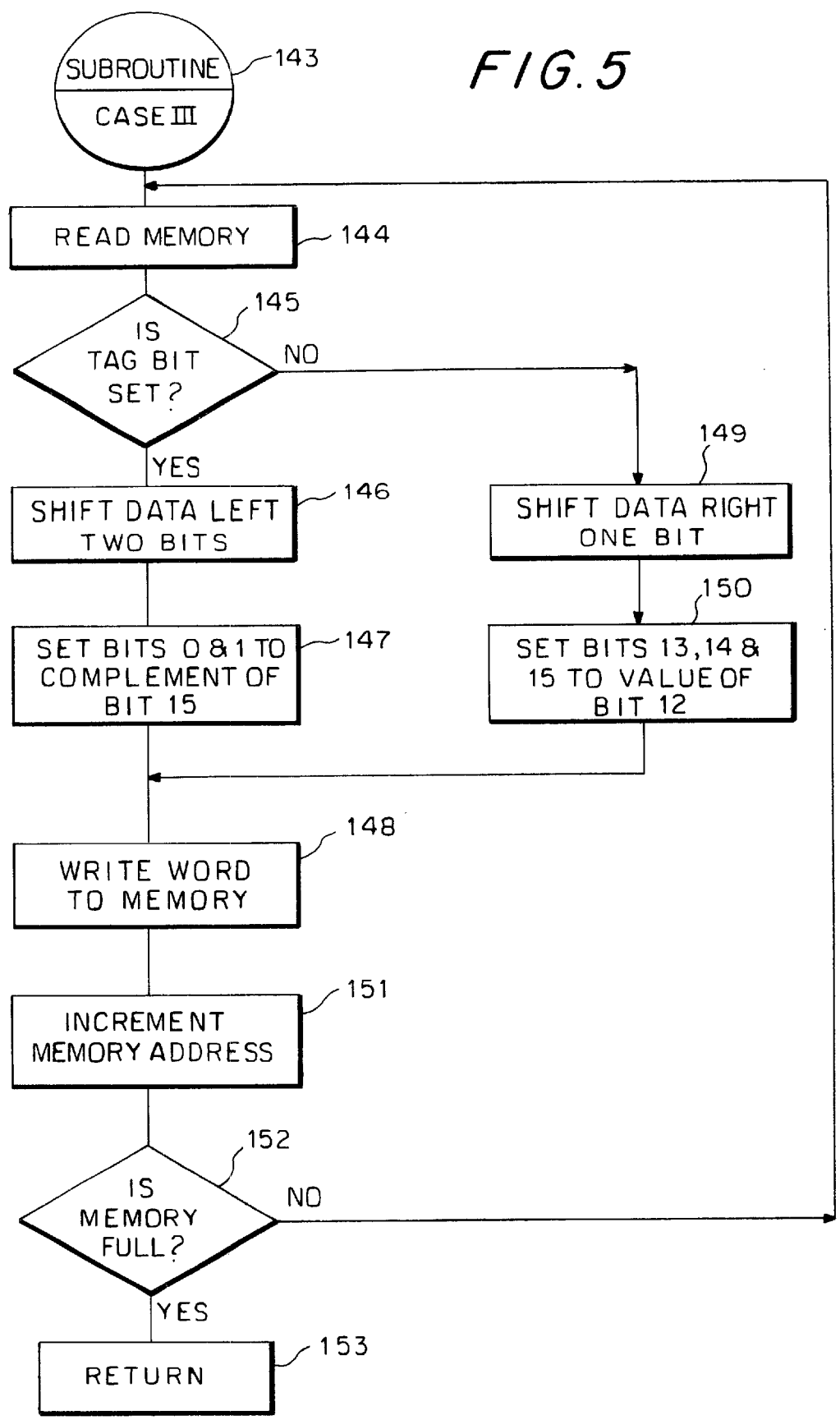

LARGE DYNAMIC RANGE DIGITIZING APPARATUS AND METHOD

BACKGROUND OF THE INVENTION

This invention relates in general to coded data conversion and more particularly, to analog to digital conversion.

For vulnerability tests where the shock loading is difficult to predict and is not always repeatable, the data acquisition procedure used for digitizing analog signals is to set the system gain low enough to allow a signal 10 times larger than expected to be recorded without clipping. Preventing clipping of the digitized signal is important since any information about peak signal is lost and the shock response spectral analysis is distorted. However, when this is done, an expected signal uses only 10% of the digitizer range, resulting in a lower signal-to-noise ratio. A worse than expected signal ($1/100^{th}$ of full scale) uses only 1% of the digitizer range and it has a poor signal-to-noise ratio.

SUMMARY OF THE INVENTION

It is therefore an object of this invention to optimize the digitizing of analog signals having a large dynamic range variation.

This and other objects of the invention are achieved by an apparatus and a method for digitizing an analog signal and optimizing the dynamic range of the digitized signal. An analog input signal is fed to each of a pair of amplifiers with different gains and then to respective analog-to-digital converters. The digital signal from the analog-to-digital converter preceded by the amplifier of higher gain is selected and stored in a digital memory when it is not clipped. When clipping occurs, the digital signal from the analog-to-digital converter preceded by the amplifier of lower gain is selected and stored in the digital memory. Once the memory is filled, an adaptive formatting program selects the most appropriate parts of the memory words to achieve maximum resolution and dynamic range in an output word size. The adaptive reformatting provides improved dynamic range over currently available single analog-to-digital converter circuits.

Although designed to optimize recording of transients which typically have a high dynamic range, this technique is also applicable to testing where unexpected results are not anticipated since the low gain analog-to-digital converter provides insurance that if anything goes wrong a higher dynamic range signal will be recorded.

Additional advantages and features will become more apparent as the subject invention becomes better understood by reference to the following detailed description when considered in conjunction with the accompanying drawings wherein:

BRIEF DESCRIPTION OF THE DRAWINGS

FIG. 3 is a flow chart of a subroutine named CASE I.

FIG. 5 is a flow chart of a subroutine named CASE III.

DETAILED DESCRIPTION

Figure 1:
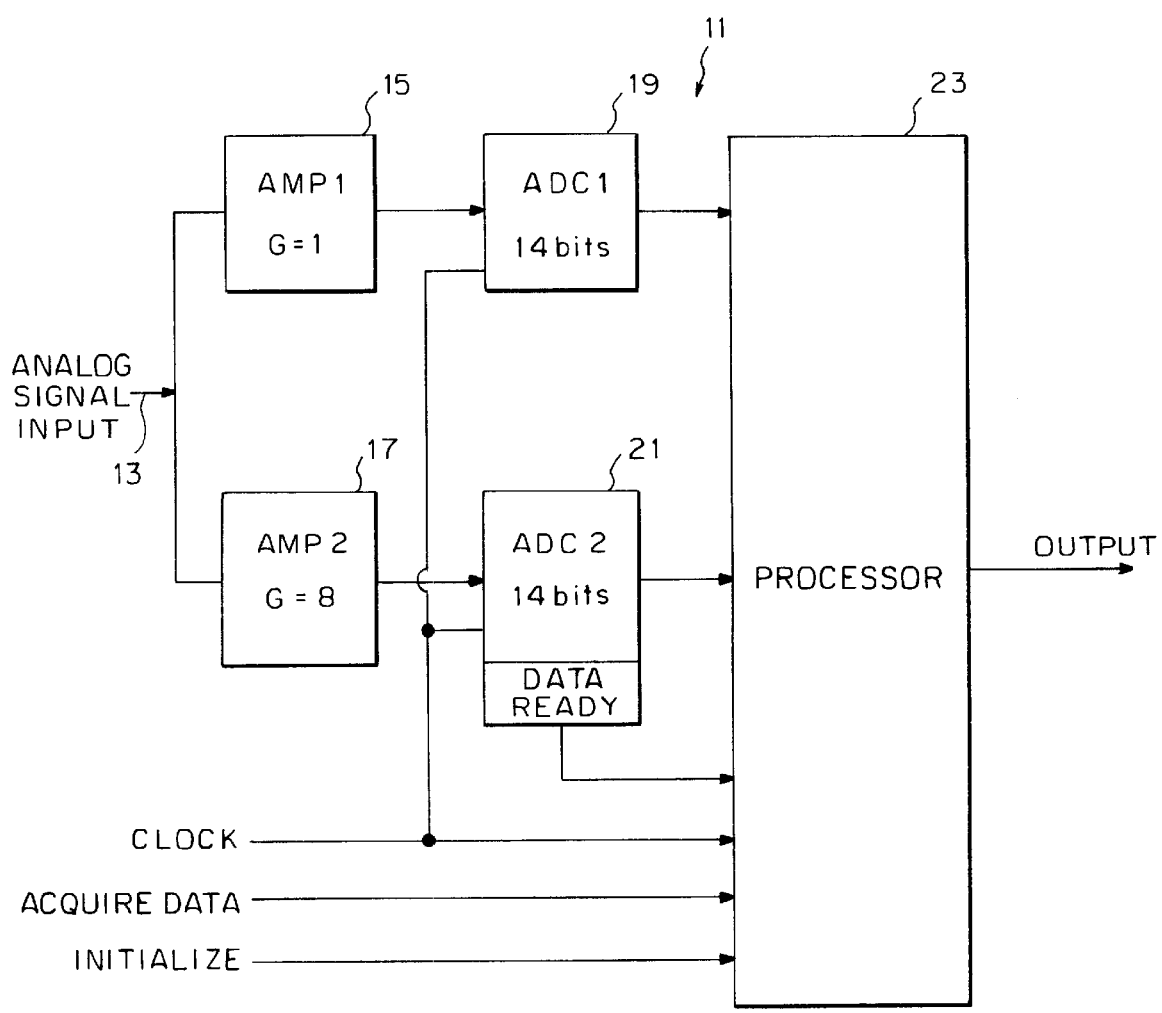
FIG. 1 is a block diagram of an embodiment of the digitizing apparatus in accordance with the invention.

Referring to FIG. 1, an apparatus 11 for digitizing an analog signal and optimizing the dynamic range of the digitized signal includes an input terminal 13, a low gain amplifier 15 and a high gain amplifier 17, each connected to the input terminal, an analog-to-digital converter 19 (indicated as ADC 1) connected to the output of the low gain amplifier, an analog-to-digital converter 21 (indicated as ADC 2) connected to the output of the high gain amplifier, and a processing means 23 connected to the outputs of both analog-to-digital converters. An exemplary system may consist, for example, of two 14 bit analog-to-digital converters preceded by two amplifiers with a gain ratio of 8. The amplifiers may be, for example, National Semiconductor model LF 353 operational amplifiers. The analog-to-digital converters may be,for example, Maxim Integrated Products Inc. model MAX 1201 analog-to-digital converters. While the processing means may take many forms, including hardware and software embodiments, conveniently it may take the form of a digital signal processor, such as, for example, a Texas Instruments model TMS320C6211 processor, having an DATA READY input connected to the DATA READY output of analog-to-digital converter ADC 2, a CLOCK input, an ACQUIRE DATA input, and an INITIALIZE input.

In operation, an analog signal to be digitized is fed to the input terminal 13 and amplified simultaneously in the low gain amplifier 15 and in the high gain amplifier 17. The analog-to-digital converter 19 (indicated as ADC 1) converts the low-gain-amplified signal to a low gain 14 bit digital signal, and the analog-to-digital converter 21 (indicated as ADC 2) converts the high-gain-amplified signal to a high gain 14 bit digital signal . The digital signal processor 23 detects whether or not the high gain digital signal is clipped. When the high gain digital signal is not clipped, the digital signal processor 23 selects and stores in its memory the high gain 14 bit digital signal. When the high gain digital signal is clipped, the digital signal processor 23 detects whether or not the low gain digital signal is greater than or equal to positive half scale or less than or equal to negative half scale, and it selects and stores in its memory the low gain 14 bit digital signal. Finally, when the memory is full, depending on the result of the detecting steps, the digital signal processor 23 adaptively reformats the stored signals to produce a 16 bit output word with maximum dynamic range. The exact format of the output word depends on the data. There are 3 cases to be considered:

CASE I- If ADC2 does not clip, then a 16 bit format can be formed by sign extending the 14 bit high gain data to 16 bits. Case I uses the 14 bits from ADC2 to produce a hybrid data format (HDF) stream with 14 bits of dynamic range. The HDF stream is shown in Table 1 in comparison with the 14 bits from ADC2. S stands for sign bit. SE stands for sign extension bit and b# stands for bit number.

TABLE 1

|      | 15 | 14 | 13 | 12  | 11  | 10  | 9  | 8  | 7  | 6  | 5  | 4  | 3  | 2  | 1  | 0  |
|------|----|----|----|-----|-----|-----|----|----|----|----|----|----|----|----|----|----|
| ADC2 | 0  | 0  | S  | b12 | b11 | b10 | b9 | b8 | b7 | b6 | b5 | b4 | b3 | b2 | b1 | b0 |
| HDF  | S  | SE | SE | b12 | b11 | b10 | b9 | b8 | b7 | b6 | b5 | b4 | b3 | b2 | b1 | b0 |

CASE II- If ADC2 clips and the output of ADC1 is less than positive half scale or greater than negative half scale, then a 16 bit format can be formed from valid high gain words (tagged with a 0 in bit 14) by sign extending the 14 bit high gain data to 16 bits, and from valid low gain words (tagged with a 1 in bit 14) by left-shifting the entire low gain word three bits with the sign bit rotated into the most significant bit and by filling the three least significant bits with the sign complement. Bit 12 can be safely discarded as it contains no useful data since the output of ADC1 is less than positive half scale or greater than negative half scale. Case II combines 14 bit data words from ADC2 with 13 bit data words from ADC 1 to produce an HDF stream that has 16 bits of dynamic range. The HDF stream is shown in Table 2 in comparison with the 14 bits from ADC2 and ADC1.

TABLE 2

|      | 15 | 14  | 13  | 12  | 11  | 10  | 9  | 8  | 7  | 6  | 5  | 4  | 3  | 2  | 1  | 0  |
|------|----|-----|-----|-----|-----|-----|----|----|----|----|----|----|----|----|----|----|
| ADC2 | 0  | 0   | S   | b12 | b11 | b10 | b9 | b8 | b7 | b6 | b5 | b4 | b3 | b2 | b1 | b0 |
| HDF  | S  | SE  | SE  | b12 | b11 | b10 | b9 | b8 | b7 | b6 | b5 | b4 | b3 | b2 | b1 | b0 |
| ADC1 | 0  | 1   | S   | b12 | b11 | b10 | b9 | b8 | b7 | b6 | b5 | b4 | b3 | b2 | b1 | b0 |
| HDF  | S  | b11 | b10 | b9  | b8  | b7  | b6 | b5 | b4 | b3 | b2 | b1 | b0 | SC | SC | SC |

CASE III- If ADC2 clips and the output of ADC1 is greater than or equal to positive half scale or less than or equal to negative half scale, then a 16 bit format can be formed by using valid high gain words (tagged with a 0 in bit 14) and by right shifting the high gain word one bit (discarding the least significant bit) and by sign extending the 13 bit data to 16 bits, and by using valid low gain words (tagged with a 1 in bit 14) and by left-shifting the entire low gain word two bits with the sign bit rotated into the most significant bit and by filling the two least significant bits with the sign complement. Case III combines 13 bit data words from ADC2 with 14 bit data words from ADC 1 to produce an HDF stream that has 16 bits of dynamic range. The HDF stream is shown in Table 3 in comparison with the 14 bits from ADC2 and ADC1.

TABLE 3

|      | 15 | 14  | 13  | 12  | 11  | 10  | 9   | 8  | 7  | 6  | 5  | 4  | 3  | 2  | 1  | 0  |
|------|----|-----|-----|-----|-----|-----|-----|----|----|----|----|----|----|----|----|----|
| ADC2 | 0  | 0   | S   | b12 | b11 | b10 | b9  | b8 | b7 | b6 | b5 | b4 | b3 | b2 | b1 | b0 |
| HDF  | S  | SE  | SE  | SE  | b12 | b11 | b10 | b9 | b8 | b7 | b6 | b5 | b4 | b3 | b2 | b1 |
| ADC1 | 0  | 1   | S   | b12 | b11 | b10 | b9  | b8 | b7 | b6 | b5 | b4 | b3 | b2 | b1 | b0 |
| HDF  | S  | b12 | b11 | b10 | b9  | b8  | b7  | b6 | b5 | b4 | b3 | b2 | b1 | b0 | SC | SC |

Figure 2A:
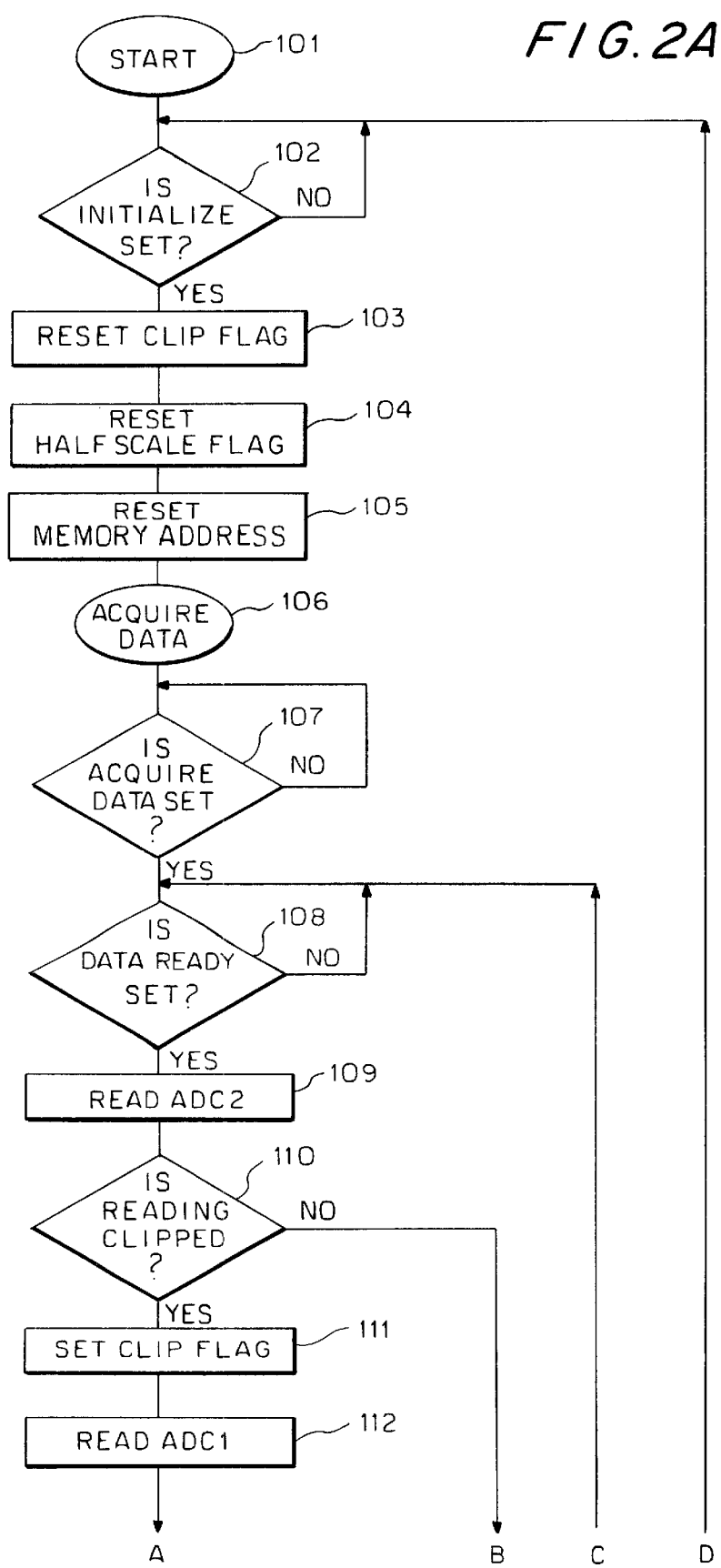
FIGS. 2A through 2B are a flow chart of programs to implement the invention.
Figure 2B:
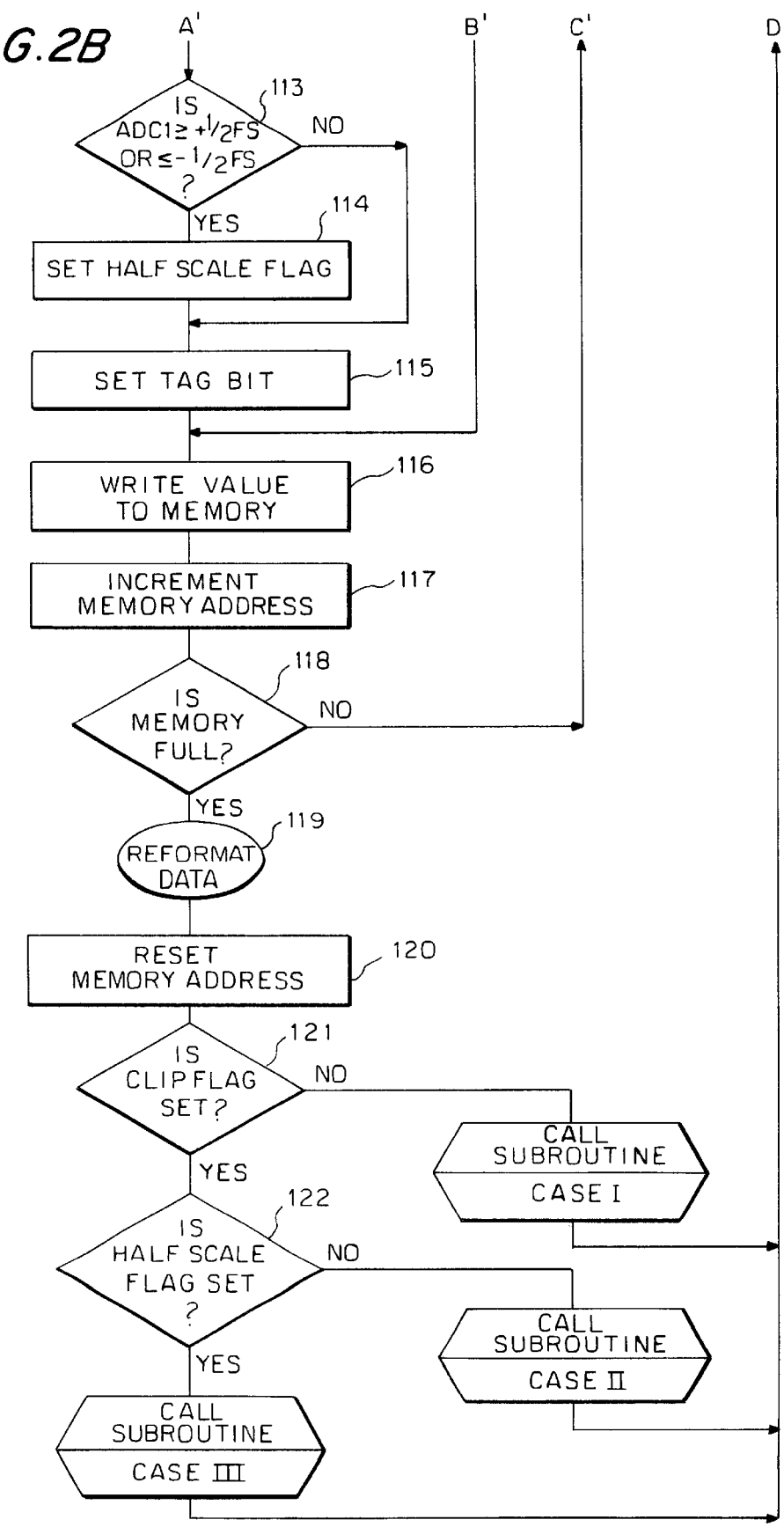
Figure 4:
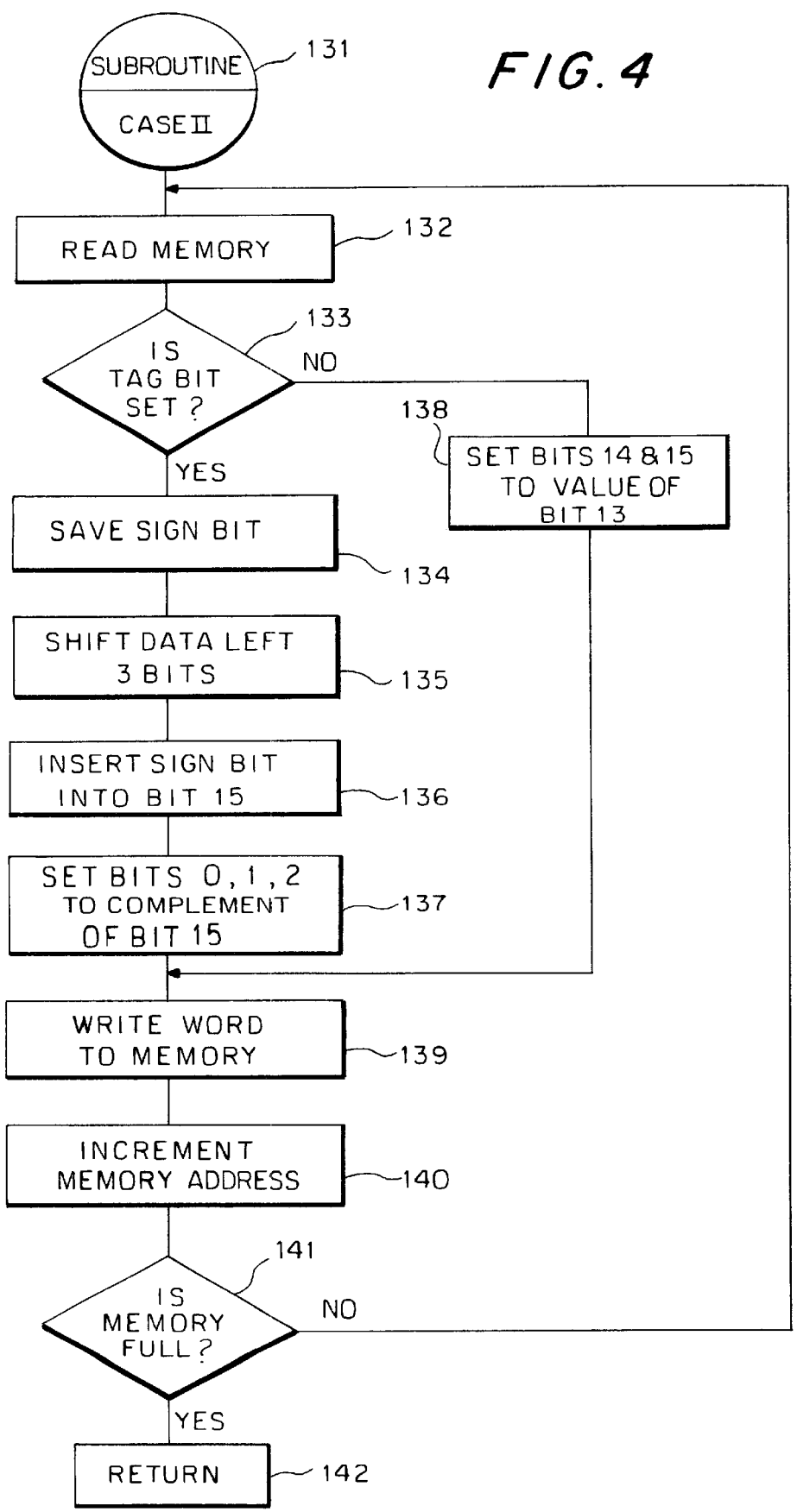
FIG. 4 is a flow chart of a subroutine named CASE II.

FIGS. 2A through 2B are a flow chart of the programs stored in the digital signal processor 23 to implement the present invention, and FIGS. 3, 4, and 5 are flow charts of subroutines for use in the programs.

Referring to FIGS. 2A through 2B, the digital signal processor 23 first executes a START program labeled at oval 101. Block 102 is a decision block; it asks, "Is the INITIALIZE input set?" If the test is negative, the program returns to block 102 and repeats until the test is positive. If the test is positive, the program branches to block 103. In block 103, a CLIP FLAG is reset. In the next block 104, a HALF SCALE FLAG is reset. Finally in block 105, a MEMORY ADDRESS is reset, and the START program is completed.

The digital signal processor 23 next executes an ACQUIRE DATA program labeled at oval 106. Block 107 is a decision block; it asks, "Is the ACQUIRE DATA input set?" If the test is negative, the program returns to block 107 and repeats until the test is positive. If the test is positive, the program branches to block 108. Block 108 is a decision block; it asks, "Is the DATA READY input set?" If the test is negative, the program returns to block 108 and repeats until the test is positive. If the test is positive, the program branches to block 109. In block 109, the analog-to-digital converter ADC 2 is read. The next block 110 is a decision block; it asks, "Is the reading clipped?" If the test is negative, the program bypasses the next five blocks and branches to block 116. In block 116, the value is written to memory. Returning to block 110, if the test is positive, the program branches to block 111. In block 111, the CLIP FLAG is set. In the next block 112, the analog-to-digital converter ADC 1 is read. Block 113 is a decision block; it asks, "Is the ADC 1 value greater than or equal to ½full scale or less than or equal to −½full scale?" If the test is negative, the program bypasses block 114 and branches to block 115. If the test is positive, the program branches to block 114. In block 114, the HALF SCALE FLAG is set. In block 115 the TAG BIT is set. In block 116, the value is written to memory.

In the next block 117, the MEMORY ADDRESS is incremented. Block 118 is a decision block; it asks, "Is the memory full?" If the test is negative, the program returns to block 108 and repeats until it is completed. If the test is positive, the ACQUIRE DATA program is completed.

When the ACQUIRE DATA program is completed, the digital signal processor 23 next executes a REFORMAT DATA program labeled at oval 119. In block 120, the MEMORY ADDRESS is reset. The next block 121 is a decision block; it asks, "Is the CLIP FLAG set?" If the test is negative, the program calls the subroutine named CASE I. Returning to block 121, if the test is positive, the program branches to block 122. Block 122 is a decision block. It asks, "Is the HALF SCALE FLAG set?" If the test is negative, the program calls the subroutine named CASE II. Returning to block 122, if the test is positive, the program calls the subroutine named CASE III.

Referring to FIG. 3, the subroutine named CASE I is labeled at circle 123. In block 124, the memory is read. In the next block 125, bits 14 and 15 are set to the value of bit 13. In block 126, the word is written to memory. In block 127, the MEMORY ADDRESS is incremented. The next block 128 is a decision block; it asks, "Is the memory full?" If the test is negative, the program returns to block 124 and repeats until the test is positive. Returning to block 128, if the test is positive, the subroutine branches to block 129. In block 129, the subroutine returns to block 102 and the digital signal processor 23 repeats the START program.

Referring to FIG. 4, the subroutine named CASE II is labeled at circle 131. In block 132, the memory is read. Block 133 is a decision block; it asks, "Is the TAG BIT set?" If the test is negative, the program bypasses the next four blocks and branches to block 139 by way of block 138. In block 138, bits 14 and 15 are set to the value of bit 13. In block 139, the word is written to memory. Returning to block 133, if the test is positive, the subroutine branches to block 134. In block 134, the sign bit is saved. In block 135, the data is shifted to the left 3 bits. In block 136, the sign bit is inserted into bit 15. In block 137, bits 0, 1, and 2, are set to the complement of bit 15. Finally, in block 139, the word is written to memory. In block 140, the MEMORY ADDRESS is incremented. The next block 141 is a decision block; it asks, "Is the memory full?" If the test is negative, the subroutine returns to block 132 and repeats until the test is positive. Returning to block 141, if the test is positive, the subroutine branches to block 142. In block 142, the subroutine returns to block 102 and the digital signal processor 23 repeats the START program.

Referring to FIG. 5, the subroutine named CASE III is labeled at circle 143. In block 144, the memory is read. Block 145 is a decision block; it asks, "Is the TAG BIT set?" If the test is negative, the program bypasses the next two blocks and branches to block 148 by way of blocks 149 and 150. In block 149, the data is shifted right one bit. In block 150, bits 13, 14 and 15 are set to the value of bit 12. In block 148, the word is written in memory. Returning to block 145, if the test is positive, the program branches to block 146. In block 146, the data is shifted left two bits. In block 147, bits 0 and 1 are set to the complement of bit 15. Finally, in block 148, the word is written in memory. In block 151, the MEMORY ADDRESS is incremented. The next block 152 is a decision block; it asks, "Is the memory full?" If the test is negative, the subroutine returns to block 144 and repeats until the test is positive. Returning to block 152, if the test is positive, the subroutine branches to block 153. In block 153, the subroutine returns to block 102 and the digital signal processor 23 repeats the START program.

It is obvious that many modifications and variations of the present invention are possible in light of the above teachings. For example, the selection of a gain ratio of 8 and the choices for the output formatting are based on expected signals and-noise. Other gain ratios, of magnitude 2 raised to the nth power, where n is an integer, may also be used. In addition, other choices of output reformatting are acceptable depending on desired results. Also, three or more analog-to-digital converters could be used to extend the technique to larger dynamic ranges. It is therefore to be understood that within the scope of the appended claims, the invention may be practiced otherwise than as described.

What is claimed as new and desired to be secured by Letters Patent of the United States is:

1. An apparatus for digitizing an analog signal and optimizing the dynamic range of the digitized signal comprising:
   (I) a low gain amplifier for receiving and amplifying the analog signal;
   (II) a high gain amplifier for receiving and amplifying the analog signal;
   (III) a first analog-to-digital converter connected to the output of the low gain amplifier for converting the low gain amplified analog signal to low gain digital data;
   (IV) a second analog-to-digital converter connected to the output of the high gain amplifier for converting the high gain amplified analog signal to high gain digital data; and
   (V) means for
      (A) detecting whether or not the high gain digital data is clipped;
      (B) selecting and storing in a memory the high gain digital data when the high gain digital signal is not clipped;
      (C) detecting whether or not the low gain digital data is greater than or equal to positive half scale dr less than or equal to negative half scale when the high gain digital data is clipped;
      (D) selecting and storing in the memory the low gain digital data when the high gain digital data is clipped;
      (E) depending on the result of the detecting steps, adaptively, reformatting the stored data when the memory is full to produce an output word with maximum dynamic range.

2. The apparatus recited in claim 1 wherein the means comprises:
   a digital signal processor.

3. The apparatus recited in claim 1 wherein the gain ratio of the amplifiers is 8.

4. The apparatus recited in claim 1 wherein the analog-to-digital converters produce 14 bit digital data.

5. An apparatus for digitizing an analog signal and optimizing the dynamic range of the digitized signal comprising:
   a low gain amplifier for receiving and amplifying the analog signal;
   a high gain amplifier for receiving and amplifying the analog signal;
   an analog-to-digital converter connected to the output of the low gain amplifier for converting the low gain amplified analog signal to low gain digital data;
   an analog-to-digital converter connected to the output of the high gain amplifier for converting the high gain amplified analog signal to high gain digital data;
   means for detecting whether or not the high gain digital data is clipped;
   means for selecting and storing in a memory the high gain digital data when the high gain digital data is not clipped;
   means for detecting whether or not the low gain digital data is greater than or equal to positive half scale or less than or equal to negative half scale when the high gain digital data is clipped;
   means for selecting and storing in the memory the low gain digital data when the high gain digital data is clipped; and means, depending on the result of the detecting steps, for adaptively reformatting the stored data when the memory is full to produce an output word with maximum dynamic range.

6. The apparatus recited in claim 5 wherein the gain ratio of the amplifiers is 8.

7. The apparatus recited in claim 6 wherein the analog-to-digital converters produce 14 bit digital data.

8. A method of digitizing an analog signal and optimizing the dynamic range of the digitized signal comprising the steps of:

(a) receiving and low-gain amplifying the analog signal;

(b) receiving and high-gain-amplifying the analog signal;

(c) converting the low-gain-amplified analog signal to low gain 14-bit digital data;

(d) converting the high-gain-amplified analog signal to high gain 14-bit digital data;

(e) performing a first test to determine whether the high gain digital data is clipped;

(f) if the first test is negative, writing the value of the high gain digital data in a memory and incrementing the memory address;

(g) if the first test is positive, setting a clip flag and performing a second test to determine if the low gain digital data value is greater than or equal to ½full scale or less than or equal to −½full scale;

(h) if the second test is negative, setting a tag bit and writing the value of the low gain digital data in the memory and incrementing the memory address;

(i) if the second test is positive, setting a half scale flag and the tag bit and writing the value of the low gain digital data in the memory and incrementing the memory address;

(j) performing a third test to determine whether the memory is full;

(k) if the third test is negative, repeating steps (e)–(j); and (l) if the third test is positive, adaptively reformatting the data stored in the memory to produce an output word with maximum dynamic range.

9. The digitizing method recited in claim 8 wherein step (l) includes the steps of:

(m) reading the data in the memory;

(n) setting bits 14 and 15 of the data to the value of bit 13; and (o) writing the data to memory.

10. The digitizing method recited in claim 9 wherein step (l) includes the steps of:

(p) incrementing the memory address after step (o);

(q) performing a fourth test to determine whether the memory is full; and (r) if the fourth test is negative, repeating steps (m)–(q).

11. The digitizing method recited in claim 8 wherein step (l) includes the steps of:

(m) reading the data in the memory;

(n) performing a fourth test to determine if the tag bit is set;

(o) if the fourth test is negative, setting bits 14 and 15 of the data to the value of bit 13;

(p) writing the data to memory;

(q) if the fourth test is positive, saving the sign bit, shifting the data left 3 bits, inserting the sign bit into bit 15, and setting bits 0,1,2 to the complement of bit 15; and (r) writing the data to memory.

12. The digitizing method recited in claim 11 wherein step (l) includes the steps of:

(s) incrementing the memory address after step (r);

(t) performing a fifth test to determine whether the memory is full; and (u) if the fifth test is negative, repeating steps (m)–(t).

13. The digitizing method recited in claim 8 wherein step (l) includes the steps of:

(m) reading the data in the memory;

(n) performing a fourth test to see if the tag bit is set;

(o) if the fourth test is negative, shifting the data right one bit, and setting bits 13, 14 and 15 to the value of bit 12;

(p) writing the data to memory;

(q) if the fourth test is positive, shifting the data left two bits, setting bits 0 and 1 to the complement of bit 15; and (r) writing the data to memory.

14. The digitizing method of claim 8 wherein step (l) includes the steps of:

(s) incrementing the memory address after step (r);

(t) performing a fifth test to determine whether the memory is full; and (u) if the fifth test is negative, repeating steps (m)–(t).

* * * * *